(12) United States Patent
Zhu et al.

(10) Patent No.: US 11,854,876 B2
(45) Date of Patent: Dec. 26, 2023

(54) SYSTEMS AND METHODS FOR COBALT METALIZATION

(71) Applicant: ASM IP Holding B.V., Almere (NL)

(72) Inventors: Chiyu Zhu, Helsinki (FI); Shinya Iwashita, Helsinki (FI); Jan Willem Maes, Wilrijk (BE); Jiyeon Kim, Tempe, AZ (US)

(73) Assignee: ASM IP Holding B.V., Almere (NL)

( * ) Notice: Subject to any disclaimer, the term of this patent is extended or adjusted under 35 U.S.C. 154(b) by 535 days.

(21) Appl. No.: 17/110,709

(22) Filed: Dec. 3, 2020

(65) Prior Publication Data
US 2021/0193515 A1     Jun. 24, 2021

Related U.S. Application Data

(60) Provisional application No. 62/951,457, filed on Dec. 20, 2019.

(51) Int. Cl.
| | | |
|---|---|---|
| *H01L 21/768* | (2006.01) | |
| *H01L 21/67* | (2006.01) | |
| *C23C 16/46* | (2006.01) | |
| *C23C 16/455* | (2006.01) | |
| *C23C 16/34* | (2006.01) | |
| *C23C 16/06* | (2006.01) | |
| *C23C 16/52* | (2006.01) | |

(52) U.S. Cl.
CPC ........ *H01L 21/76876* (2013.01); *C23C 16/06* (2013.01); *C23C 16/34* (2013.01); *C23C 16/45546* (2013.01); *C23C 16/463* (2013.01); *C23C 16/52* (2013.01); *H01L 21/67167* (2013.01); *H01L 21/76864* (2013.01)

(58) Field of Classification Search
CPC ......... H01L 21/67167; H01L 21/76864; H01L 21/76876; H01L 21/76877; H01L 21/76879; H01L 21/76898; H01L 2221/1089; C23C 16/06; C23C 16/34; C23C 16/45546; C23C 16/463; C23C 16/52
See application file for complete search history.

(56) References Cited

U.S. PATENT DOCUMENTS

| | | | | |
|---|---|---|---|---|
| 2013/0251903 | A1 | 9/2013 | Han | |
| 2013/0320505 | A1* | 12/2013 | Emesh | ............. H01L 21/76846 438/653 |
| 2014/0103534 | A1* | 4/2014 | Emesh | ................ H01L 21/2885 438/653 |

(Continued)

FOREIGN PATENT DOCUMENTS

WO     WO 2017/214088     12/2017

*Primary Examiner* — Brook Kebede
(74) *Attorney, Agent, or Firm* — Banner & Witcoff, Ltd.

(57) ABSTRACT

Systems and methods are described for depositing a TiN liner layer and a cobalt seed layer on a semiconductor wafer in a cobalt metallization process. In some embodiments the wafer is cooled after deposition of the TiN liner layer and/or the cobalt seed layer. In some embodiments the TiN liner layer and cobalt seed layer are deposited in process modules that are part of a semiconductor processing apparatus that also includes one or more modules for cooling the substrate. In some embodiments the cobalt seed layer may comprise a mixture of TiN and cobalt, a nanolaminate of TiN and cobalt layers or a graded TiN/Co layer.

13 Claims, 4 Drawing Sheets

(56) References Cited

U.S. PATENT DOCUMENTS

| | | |
|---|---|---|
| 2014/0234550 A1 | 8/2014 | Winter et al. |
| 2015/0325477 A1* | 11/2015 | Shaviv ............. H01L 21/76882 205/123 |
| 2016/0326645 A1 | 11/2016 | Winter et al. |
| 2018/0044788 A1 | 2/2018 | Chen et al. |
| 2018/0130706 A1 | 5/2018 | Chen et al. |

* cited by examiner

SYSTEMS AND METHODS FOR COBALT METALIZATION

REFERENCE TO RELATED APPLICATION

This application claims priority to U.S. Provisional Application No. 62/951,457, filed Dec. 20, 2019, which is incorporated by reference herein.

FIELD OF THE INVENTION

The present application relates to the fabrication of integrated circuits, particularly to methods and apparatuses for cobalt metallization.

BACKGROUND

Cluster tools used in the semiconductor processing of wafers or other workpieces typically comprise a central wafer handling chamber, or transfer chamber, surrounded by a number of process chambers within which various processes are carried out on the wafers (e.g., deposition, etching, doping, annealing and oxidizing). A robot is provided in the transfer chamber for moving the wafers within the cluster tool. The transfer chamber is typically isolated from each of the process chambers by gate valves.

Current process flows for cobalt metallization involve deposition of a liner layer and an adhesion layer. A cobalt seed layer may be deposited by a chemical vapor deposition (CVD) method, followed by cobalt plating.

SUMMARY

In some aspects, cobalt metallization processes and apparatuses for carrying out the processes are provided. Cobalt metallization processes can include deposition of a thin TiN liner layer over a three-dimensional structure, such as a trench on a semiconductor substrate, followed by deposition of a thin seed layer, for example a seed layer comprising cobalt. One or both of the TiN liner layer and the seed layer may be deposited, for example, by atomic layer deposition (ALD) processes. Following deposition of the TiN liner layer and the seed layer, cobalt may be deposited to fill the three-dimensional structure, such as by plating.

In some embodiments, semiconductor wafer processing apparatuses are provided. In some embodiments a semiconductor wafer processing apparatus may comprise a wafer handling chamber, a wafer handling robot, a first deposition process module, a second deposition process module and a cooling stage. In some embodiments the apparatus additionally comprises a clustered turbo pump. In some embodiments the first deposition process module and the second deposition process module are the same.

In some embodiments an apparatus may comprise controls set to sequentially move a wafer comprising a three-dimensional structure from the wafer handling chamber to the first deposition process module, deposit a TiN liner layer on the wafer at a first deposition temperature in the first deposition process module, move the wafer to the cooling stage, cool the wafer to below the first deposition temperature, move the wafer to the second deposition process module, and deposit a cobalt seed layer over the TiN liner layer on the wafer at a second deposition temperature. In some embodiments the cobalt seed layer comprises a nanolaminate.

In some embodiments the controls are set to move the wafer from the first deposition process module to the cooling stage after depositing the cobalt seed layer. The wafer may subsequently be cooled to below the second deposition temperature.

In some embodiments the controls are set to deposit the TiN liner layer on the wafer in the first deposition process module by atomic layer deposition (ALD). In some embodiments the controls are set to deposit the cobalt seed layer on the wafer in the second deposition process module by ALD.

In some embodiments methods of cobalt metallization are provided. The methods may comprise depositing a TiN liner layer on a three-dimensional feature of a substrate, such as a semiconductor wafer. The TiN liner layer may be deposited, for example, by ALD. The ALD process may be carried out at a first deposition temperature in a first deposition module of a deposition apparatus. The wafer may subsequently be cooled to a temperature below the first deposition temperature. For example, the wafer may be moved to a cooling module to be cooled to the temperature below the first deposition temperature. Following cooling the wafer may be moved to a second deposition module of a deposition apparatus. In some embodiments the second deposition module may be the same as the first deposition module.

In some embodiments in the second deposition module a cobalt seed layer may be deposited directly over and contacting the TiN liner layer. The cobalt seed layer may be deposited, for example, by ALD. The ALD process for depositing the cobalt seed layer may be carried out at a second deposition temperature. Cobalt may be deposited over the cobalt seed layer, for example by plating.

In some embodiments the wafer is cooled to a temperature below the second deposition temperature after depositing the cobalt seed layer and prior to depositing cobalt over the cobalt seed layer by plating.

In some embodiments cooling the wafer to a temperature below the first deposition temperature and/or below the second deposition temperature comprises moving the wafer to a cooling chamber. In some embodiments the wafer is cooled to a temperature below the first deposition temperature or below the second deposition temperature by placing the wafer on a cooling stage.

In some embodiments the cobalt seed layer comprises a mixture of cobalt and TiN. In some embodiments the cobalt seed layer additionally comprises a cobalt layer over the seed layer comprising a mixture of cobalt and TiN.

In some embodiments the cobalt seed layer comprises a nanolaminate of cobalt and TiN layers. In some embodiments the nanolaminate comprises a top layer of cobalt. In some embodiments the seed layer comprises a layer of cobalt over the nanolaminate.

In some embodiments the cobalt seed layer comprises a graded layer of TiN and cobalt. The graded layer may comprise an increasing concentration of cobalt from an interface with the underlying TiN layer to the upper surface of the graded layer.

In some embodiments the TiN layer is treated prior to depositing the cobalt seed layer. For example, in some embodiments the substrate is exposed to a titanium halide, such as $TiCl_4$, after depositing the TiN liner layer and prior to depositing the cobalt seed layer.

DETAILED DESCRIPTION

Figure 1:
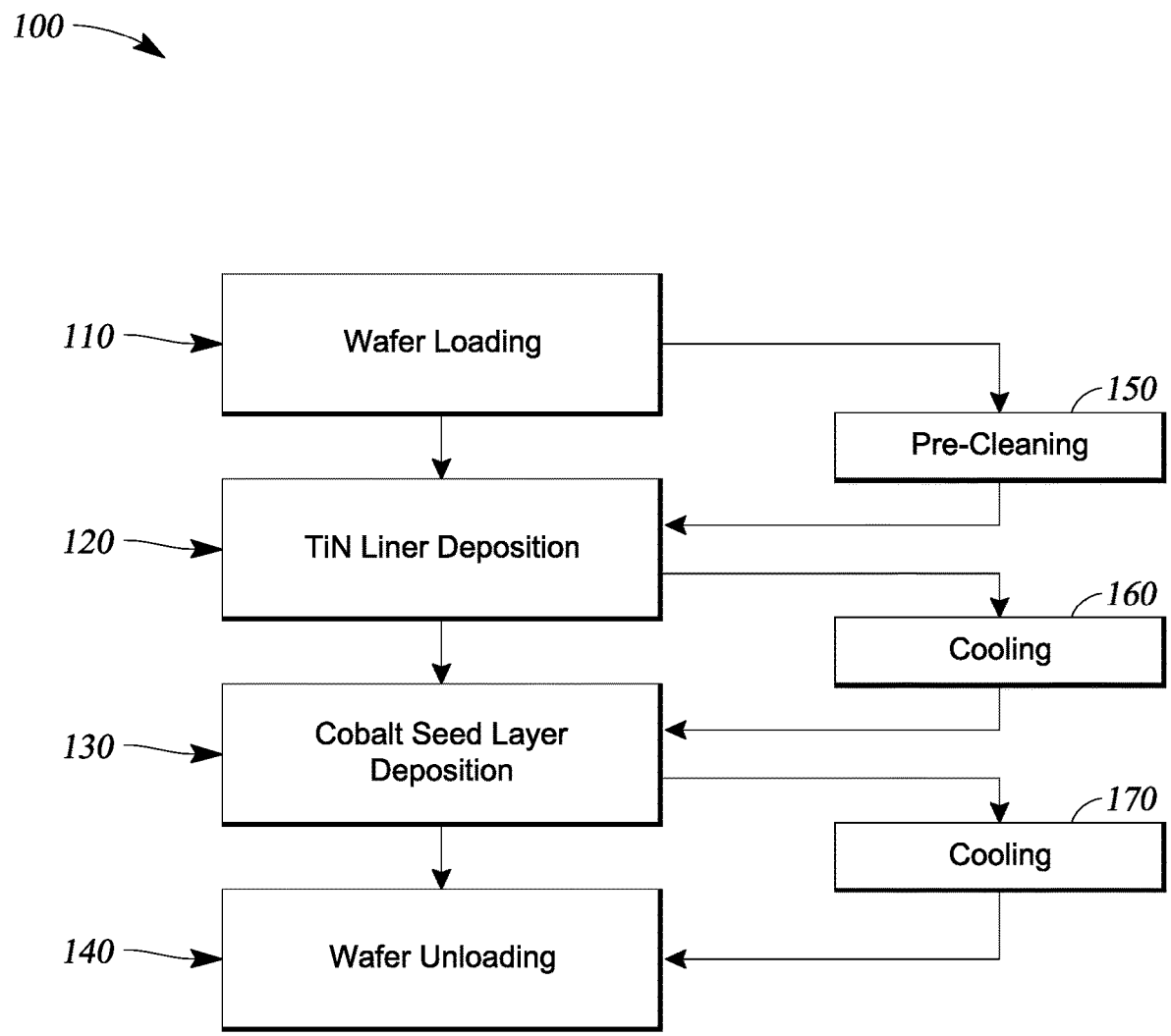
FIG. 1 is a flow chart illustrating a process flow for forming a TiN liner layer and a cobalt seed layer in a cobalt metallization process.

Cobalt metallization processes can include deposition of a thin TiN liner layer over a three-dimensional structure, such as a trench on a semiconductor substrate, followed by deposition of a thin seed layer, for example a seed layer comprising cobalt. One or both of the TiN liner layer and the seed layer may be deposited, for example, by atomic layer deposition (ALD) processes. Following deposition of the TiN liner layer and the seed layer, cobalt may be deposited to fill the three-dimensional structure, such as by plating.

In some embodiments the seed layer comprises a cobalt layer. The cobalt layer may be deposited, for example, by ALD.

In some embodiments the seed layer comprises a nanolaminate of thin TiN and Co layers. In some embodiments the top layer of the nanolaminate is a Co layer. In some embodiments the top layer of the nanolaminate is a mixture of cobalt and TiN. In some embodiments the top layer of the nanolaminate is a cobalt rich layer. In some embodiments the bottom layer of the nanolaminate is a TiN layer. In some embodiments a nanolaminate of TiN and Co layers serves as both the liner layer and seed layer. In some embodiments a thinner TiN liner layer is used in combination with a seed layer comprising ultrathin Co and ultrathin TiN layers such that the overall liner and seed layers are reduced in thickness. In some embodiments a seed layer comprising a nanolaminate of thin TiN and Co layers is deposited as part of a cobalt metallization process in which a separate liner layer is not utilized. For example, in a cobalt metallization process a seed layer comprising a nanolaminate of thin TiN and Co layers may be deposited directly over a three-dimensional structure, such as a trench on a semiconductor substrate, followed by deposition of cobalt to fill the three dimensional structure, where a separate liner layer is not deposited prior to deposition of the nanolaminate layer. In some embodiments a cobalt layer may be deposited over the nanolaminate to form a seed stack.

The TiN and Co layers of the nanolaminate may be ultrathin. In some embodiments the nanolaminates comprise an ultrathin cobalt layer and an ultrathin TiN layer. For example, in some embodiments a TiN layer in a nanolaminate may be about 1 nm and a cobalt layer may be about 1-2 nm. In some embodiments one or more of the TiN layers in a nanolaminate may be about 3 nm or less, about 2 nm or less, about 1.5 nm or less, about 1.2 nm or less, about 1.0 nm or less, or about 0.8 nm or less. In some embodiments one or more Co layers in a nanolaminate are about 4 nm or less, about 3 nm or less, about 2.5 nm or less, about 2 nm or less, or about 1.5 nm or less.

In some embodiments the nanolaminate comprises two or more ultrathin cobalt layers and two or more ultrathin TiN layers. In some embodiments the layers of TiN and Co in the nanolaminate are not distinguishable from each other. In some embodiments the TiN and Co layers are deposited by ALD. In some embodiments the cobalt seed layer comprises TiN and Co deposited in such a way as to form a mixture of TiN and Co. For example, TiN and Co may be deposited by ALD in sub-cycles that allow for mixing of the Co and TiN such that separate identifiable Co and TiN layers are not formed. In some embodiments the TiN layers and Co layers are so thin that they overlap, such that mixing of TiN and Co occurs.

In some embodiments additional cobalt may be deposited over the TiN and Co nanolaminate or mixture to form a seed stack. The additional cobalt may be deposited by ALD.

In some embodiments the cobalt seed layer comprises a graded TiN/Co thin film. The graded TiN/Co film may be deposited by an ALD process, including an ALD sub-cycle for depositing TiN and an ALD sub-cycle for depositing Co. The TiN sub-cycle and Co sub-cycle are repeated at a selected ratio that changes over time to form a graded layer. In some embodiments a graded TiN/Co thin film serves as both the liner layer and the seed stack. In some embodiments a graded TiN/Co thin film may start as TiN on the lower surface and end as cobalt on the upper surface. In some embodiments an ALD process for forming a graded TiN/Co thin film comprises conducting one, two or more TiN ALD sub-cycles, followed by a varying ratio of TiN ALD sub-cycles and Co sub-cycles and ends with one, two or more Co ALD sub-cycles. In some embodiments additional cobalt may be deposited over the graded layer to form a seed stack. The additional cobalt may be deposited by ALD.

Methods for depositing TiN and Co by ALD are known in the art. For example, TiN can be deposited by ALD using a titanium precursor such as $TiCl_4$ and a nitrogen containing precursor, such as ammonia or hydrazine or plasmas, excited or atomic species comprising nitrogen. As discussed below, in some embodiments the ALD process comprises exposing the substrate to $TiCl_4$ as the last step in the process. Cobalt can be deposited, for example, by an ALD process using a cobalt precursor, such as CoDAD (bis(1,4-di-t-butyl-1,3-diazabutadienyl)cobalt) and its derivatives and a second reactant, such as hydrogen. In some embodiments the substrate is alternately and sequentially contacted with the cobalt precursor and the second reactant. In some embodiments Co may be deposited by an ALD process described in US2013/0251903, US2014/0234550, US2016/0326645, US 2018/0044788, US 2018/0130706, or WO 2017/214088, each of which is incorporated by reference herein.

In some embodiments the substrate may be treated prior to or after one or more of the deposition steps for forming the liner layer and/or seed layer stack. In some embodiments the substrate is treated prior to and/or after one or more Co ALD cycles. In some embodiments the substrate is treated prior to and/or after one or more TiN ALD cycles. For example, the substrate may be cooled after depositing a TiN liner layer, after depositing a cobalt seed stack or both. In some embodiments the substrate is cooled after depositing TiN by one or more ALD cycles. In some embodiments the substrate is cooled after depositing Co by one or more ALD cycles. In some embodiments the substrate is cooled to a temperature below the deposition temperature. In some embodiments the substrate is cooled to room temperature.

In some embodiments the substrate is treated prior to deposition of a first TiN liner layer. For example, the substrate may be subjected to a pre-cleaning treatment. In some embodiments the pre-cleaning treatment may comprise outgas sing. In some embodiments a pre-cleaning treatment is carried out prior to conducting one or more TiN ALD cycles.

In some embodiments the substrate is treated after deposition of a TiN liner layer and prior to deposition of a cobalt seed layer or seed stack, such as a nanolaminate seed stack. For example, a substrate may be cooled after deposition of a TiN layer and prior to subsequent deposition of a cobalt containing layer. In some embodiments a substrate may be cooled after deposition of a TiN layer by one or more ALD cycles and prior to subsequent deposition of a cobalt seed stack by one or more ALD cycles. In some embodiments a substrate is subjected to a plasma treatment after TiN deposition and prior to subsequent deposition, for example prior to subsequent deposition of a cobalt-containing layer In some embodiments a substrate is subjected to a halide treatment after TiN deposition and prior to subsequent deposition, for example prior to subsequent deposition of a seed layer or seed stack. The halide treatment may improve the surface roughness of the subsequently deposited Co film. In some embodiments the halide treatment comprises exposing the substrate to $TiCl_4$. In some embodiments the halide treatment comprises exposing the substrate to a titanium halide precursor that was used in the deposition of the TiN layer. For example, following deposition of TiN by ALD using TiCl4 as the titanium precursor, the substrate may be exposed to $TiCl_4$ prior to subsequent deposition. In some embodiments the exposure to the titanium halide following TiN deposition may be for the same duration and under the same conditions as in the TiN deposition process. In some embodiments this exposure may be achieved by utilizing an ALD process for depositing the TiN layer comprising alternately and sequentially exposing the substrate to a titanium halide such as $TiCl_4$ and a nitrogen reactant, in which the last step in the ALD process comprises exposing the substrate to the titanium halide. In some embodiments TiN is deposited by repeating an ALD cycle in which the substrate is sequentially exposed to a nitrogen reactant and $TiCl_4$, such that the ALD process ends with exposure to $TiCl_4$.

In some embodiments a substrate is treated after deposition of a cobalt seed layer or seed stack, such as a nanolaminate, and prior to subsequent cobalt plating. For example, the substrate may be cooled after cobalt seed layer deposition or after seed stack deposition. In some embodiments a substrate is cooled after deposition of a cobalt seed stack by one or more ALD cycles and subsequent to cobalt plating.

Following deposition of the seed layer or seed stack and any intervening treatment, cobalt is deposited, such as by plating. Following plating the substrate may be further treated, for example by cooling.

FIG. 1 is a flowchart illustrating a process 100 for cobalt metallization comprising depositing a TiN liner layer and a cobalt-containing seed stack. A semiconductor wafer comprising a three-dimensional structure is loaded into a processing apparatus 110. In some embodiments the three-dimensional structure may comprise a trench, a via or both a trench and via, such as in a dual-damascene context. Controls on the processing apparatus are set to carry out the illustrated steps. A TiN liner layer is deposited on the structure on the wafer 120, such as by an ALD process. Optionally, the wafer may be subject to a treatment such as a pre-cleaning 150 prior to deposition of the TiN liner layer 120 as illustrated. The treatment may take place in the same chamber as the TiN deposition or in a different chamber.

After deposition of the TiN liner layer 120, the wafer may optionally be cooled 160 (or treated in another way) prior to deposition of a cobalt seed layer 130, such as by an ALD process. The cooling may take place in the same chamber as the TiN deposition or the Co deposition or may take place in a different chamber.

In some embodiments after TiN deposition the substrate is treated by exposure to $TiCl_4$. Treatment may be carried out in the same chamber as the TiN deposition or may take place in a different chamber. The exposure to $TiCl_4$ may be for the same duration as during each cycle of the ALD process.

As described above, in some embodiments the cobalt seed layer comprises a cobalt layer deposited by ALD. In some embodiments the cobalt seed layer comprises a TiN and Co nanolaminate. A cobalt layer may be deposited over the nanolaminate to form a seed stack. In some embodiments the cobalt seed layer comprises a mixture of TiN and Co. A cobalt layer may be deposited over the mixture to form a seed stack. In some embodiments the cobalt seed layer comprises a graded layer of TiN and Co. For example, a graded layer may start with TiN at the lower surface adjacent to the TiN liner layer, comprise an increasing concentration of cobalt and a decreasing concentration of TiN in the direction from the lower surface to the upper surface, and comprise an upper surface of cobalt. Again, a cobalt layer may be deposited over the graded layer to form a seed stack. In some embodiments the cobalt layer may be deposited by continuing the ALD cycle used to deposit cobalt in forming the graded layer.

In some embodiments TiN deposition and Co deposition take place in the same process chamber. In some embodiments TiN deposition takes place in one process chamber and Co deposition takes place in a different process chamber.

Following deposition of the cobalt seed layer 130, the wafer may optionally be cooled 170 prior to being unloaded from the processing apparatus 140. Again, the cooling may take place in the same chamber as the deposition or in a different chamber. In some embodiments the wafer is subject to further processing, such as deposition of cobalt by plating.

As mentioned above, in some embodiments a thinner TiN layer than typical is able to be utilized due to the use of a cobalt seed layer as described herein. Deposition of the TiN liner layer may be followed by a cobalt seed layer that is formed by depositing a TiN/Co nanolaminate or TiN/Co mixture. Additional cobalt may be deposited by ALD or by another process to complete the seed layer. In some embodiments, an ultra-thin cobalt layer bay be deposited by ALD followed by deposition of an ultra-thin TiN layer. For example, rather than depositing a 1 nm TiN layer followed by a 2 nm Co seed layer, a 0.5 nm TiN layer may be deposited, followed by deposition of a 0.5 nm layer of TiN and Co. The 0.5 nm layer of TiN and Co may be deposited by an ALD TiN sub-cycle and an ALD Co sub-cycle. An additional 1.5 nm of cobalt may then be deposited to complete the seed layer and form a seed stack. As a result, the total thickness of the liner and seed layer (or seed stack) is reduced by 0.5 nm, improving the metallization process by allowing for additional cobalt metal in the structure.

Figure 2:
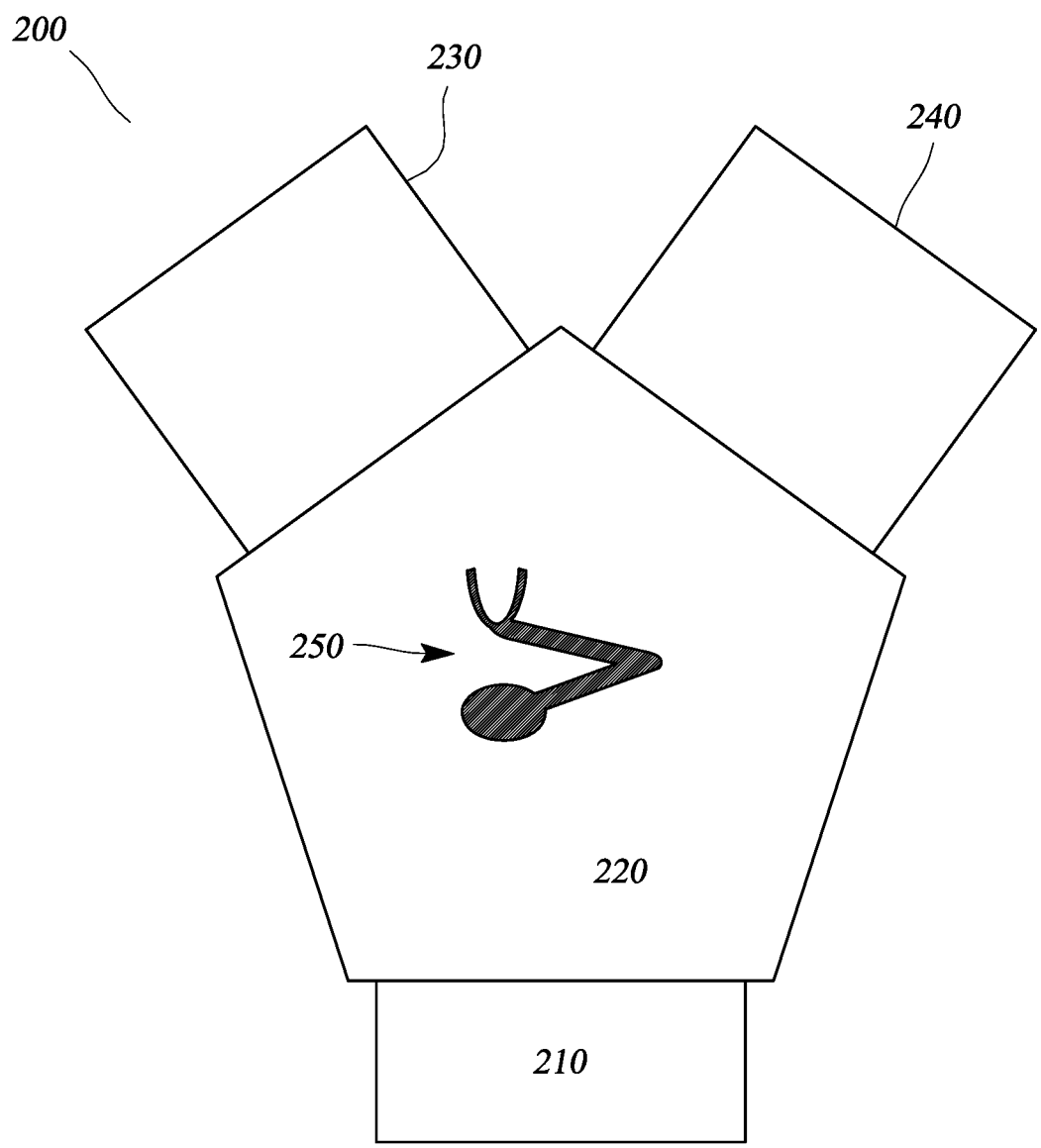
FIG. 2 is a top down schematic of a wafer processing apparatus according to some embodiments.

In some embodiments, each of the ALD deposition steps and treatment steps is carried out in a semiconductor wafer processing apparatus, such as a cluster tool. FIG. 2 is a top-down schematic diagram of an exemplary semiconductor processing apparatus 200 in accordance with some embodiments. Semiconductor processing apparatus 200 comprises a central substrate or workpiece handling chamber, referred to herein as a wafer handling chamber (WHC) 220, connected to at least one process module (PM) 230, 240. FIG. 2 shows the WHC 220 surrounded by two process modules 230, 240. In alternative embodiments, the apparatus 200 can include a greater or lesser number of process modules. For example, the apparatus 200 can include only one process module connected to the WHC 220, or can include more than the illustrated two process modules 230, 240. In addition, the apparatus 200 can be configured to perform additional or other types of processes and can be configured to carry out the same process in two or more of the process modules 230, 240. A workpiece handling robot 250 stationed in the wafer handling chamber 220 can add and remove substrates from a load lock chamber (LLC) 210 and from individual process modules 230, 240. The apparatus 200 can also include one or more intermediate process modules 225 which can be used, for example, as temperature control modules. Temperature control modules can be used to reduce or raise the temperature of a wafer prior to or after a particular processing step.

In some embodiments the apparatus 200 includes a turbo pump (not shown). The turbo pump may allow for a lower base pressure. In some embodiments the layers deposited when a turbo pump is used have lower impurities. This may be due to the reduction of residue in the chamber, such as moisture or $O_2$. The turbo pump may be used to increase the flow of one or more gases in one or more areas of the apparatus. For example, the turbo pump may be used to increase the flow of gas in the WHC 220 or the load lock chamber 210. In some embodiments the turbo pump may allow for higher gas flow at the same pressure.

To operate the wafer processing apparatus 200, a user enters a process recipe into a controller (not shown). The process recipe may include instructions regarding process sequences, process times, process temperatures, pressures and gas flows. For example, the controller may control each step in the deposition of a TiN layer and cobalt seed layer or seed stack on a wafer in a cobalt metallization process, for example as described above with reference to FIG. 1.

A wafer processing apparatus as illustrated in FIG. 2 can be configured for cobalt metallization to deposit a TiN liner layer and a cobalt seed layer or seed stack on a wafer. The apparatus 200 can comprise a deposition process module 230, and an intermediate process module 240. The deposition process module 230 may be configured for deposition of one or both of TiN and Co, for example by ALD. The intermediate process module 240 may be configured to treat the substrate before or after deposition of TiN and/or Co. For example, intermediate process module 240 may be a temperature control module, such as a cooling module in which the substrate is cooled before or after deposition of TiN and/or Co, or a pressure module to control the pressure. That is, the substrate can be moved to process module 240 to be cooled prior to or subsequent to another processing step. In some embodiments the apparatus 200 may comprise one or more other intermediate process modules (not shown) that can be used for other processing. In some embodiments the intermediate process module 240 (or a different intermediate process module (not shown)) may be used to pre-clean a substrate prior to deposition. For example one intermediate process module 240 may be used as a cooling module while a second intermediate process module (not shown) may be used as a pre-clean module. The wafer processing apparatus comprises controls set to control the intermediate processing modules to provide the desired reaction conditions.

In some embodiments the intermediate processing module 240 is a wafer temperature control module, such as a wafer cooling module. The wafer processing apparatus comprises controls set to achieve a desired temperature in the temperature control module. A wafer cooling module may be maintained at a temperature below the temperature of the wafer in a prior deposition process or other prior processing. In some embodiments a wafer temperature control module may be configured to be provided with an inert gas flow, for example during cooling. In some embodiments a temperature control module is maintained at room temperature. In some embodiments the temperature control module is actively cooled. In some embodiments the temperature control module comprises one or more cooling stages that are actively cooled or heated. A wafer may be placed on the cooling stage by the robot. In some embodiments cooling or heating is by thermoelectric cooling or heating. In some embodiments cooling or heating is achieved by gas flow, such as by inert gas flow. In some embodiments a temperature control module is able to control the wafer temperature from about 0° C. to about 300° C. In some embodiments the temperature control module controls the wafer temperature from about room temperature to about 150° C. In some embodiments the temperature control module controls the wafer temperature from about 0 to about 400° C., about 15 to about 350° C., about 20 to about 300° C., about 25 to about 250° C., about 30 to about 200° C., about 20 to about 150° C. or about 20 to about 100° C. In some embodiments a temperature control module, such as a cooling module, reduces the temperature such that it is about 10° C. or more, about 20° C. or more, about 40° C. or more, about 60° C. or more, about 80° C. or more, about 100° C. or more, about 150° C. or more, about 200° C. or more, about 250° C. or more, about 300° C. or more, or about 400° C. or more below the TiN deposition (module reaction) temperature.

In some embodiments the pressure in one or more locations in the deposition apparatus, for example in an intermediate processing module, a deposition module or the WHC, is controlled to a pressure of about 2000 torr. In some embodiments the pressure is controlled to 2000 torr or less, 1000 torr or less, 760 torr or less, 100 torr or less, 10 torr or less, 1 torr or less, 0.1 torr or less, 1E-4 torr or less, 1E-6 torr or less, 1E-8 torr or less. In some embodiments the pressure is controlled to about 10 torr or greater, 50 torr or greater, 100 torr or greater, 400 torr or greater, 760 torr or greater, or 1000 torr or greater. The deposition processing apparatus comprises controls set to provide the desired pressure in each area of the deposition apparatus, such as in deposition modules, intermediate processing modules and the WHC.

In some embodiments the environment in an intermediate processing module, such as a cooling module, or in a deposition module or the WHC, comprises inert gas, such as $N_2$ or a noble gas such as He or Ar. In some embodiments the environment comprises a reducing gas such as $N_2/H_2$, $H_2$ or mixtures thereof with an inert gas or other reducing gases, such as gases comprising an organic reducing agent. In some embodiments the environment may comprise excited, plasma or radical species of H. The deposition processing apparatus comprises controls set to provide the appropriate environment.

In some embodiments a substrate is in an intermediate processing module, such as a cooling module, for about 1 s to 3600 s, about 5 s to 1200 s, about 10 s to 600 s or about 20 s to 300 s. In some embodiments a substrate is in an intermediate processing module, such as a cooling module, for greater than about 10 s, greater than about 30 s, greater than about 60 s, greater than about 90 s, greater than about 120 s, greater than about 180 s, greater than about 300 s or greater than about 600 s. In some embodiments a substrate is in an intermediate processing module for less than about 600 s, less than about 300 s, less than about 180 s, less than about 120 s, less than about 60 s or less than about 30 s. The deposition processing apparatus includes controls set to maintain the substrate in the intermediate processing apparatus for a preselected amount of time.

As mentioned above, in some embodiments a processing apparatus may comprise more than one intermediate processing module. For example, a processing apparatus may comprise an intermediate processing module configured for pre-cleaning of the wafer as well as an intermediate processing module configured to control the temperature of the wafer. In some embodiments a processing apparatus may comprise two or more temperature control modules, such as two or more wafer cooling modules. In some embodiments two or more temperature control modules are set to different temperatures. In some embodiments the cooling module or the temperature control module can be used, in addition to the temperature management or solely for wafer queue time management to minimize the queue time and thus make the throughput faster.

In some embodiments a single processing module may serve two or more different purposes. For example, a processing module may serve both as a pre-clean module and as a temperature control module. That is, a wafer may be subject to pre-cleaning in a particular processing module, and then later moved into the same processing module for cooling after a deposition step.

In some embodiments cooling may take place in a separate portion of the processing apparatus and not in a processing module. For example, a transfer chamber may serve as a cooling module. In some embodiments a wafer may be moved to a transfer chamber for cooling after a deposition process, such as after deposition of TiN and/or Co. In some embodiments cooling may take place in the WHC, for example on a cooling stage or on the wafer transfer robot, as described in more detail below.

In some embodiments an intermediate process module may be configured to treat more than one wafer simultaneously or sequentially. In some embodiments intermediate processing modules, such as cooling modules are configured to treat two or more substrate, three or more substrates, five or more substrates, seven or more substrates or ten or more substrates. For example, a cooling module may comprise two or more cooling stages on which two or more substrates may be cooled before or after deposition or other processing steps. In some embodiments two or more substrates are cooled simultaneously. In some embodiments one or more wafers that have already been cooled are removed from one cooling stage in the cooling module while a second wafer or set of wafers that is to be cooled is moved onto a second stage in the processing module.

A cooling stage, whether located in a processing module or in the WHC, may include one or more temperature control features. The cooling stage may include one or more cooling elements configured to facilitate desired decrease in a temperature of a wafer on the cooling stage. The cooling stage may also comprise one or more heating elements configured to facilitate a desired increase in the temperature of the wafer when desired. One or both of the cooling elements and heating elements may be embedded within one or more portions of the stage. For example, a plurality of the cooling and/or heating elements may be distributed across a lateral dimension of the substrate stage so as to facilitate desired temperature control. In some embodiments, a cooling element comprises a cooling line configured to supply a coolant to the cooling body. In some embodiments one or more cooling or heating elements are located in a cooling module away from the cooling stage itself. One or more cooling stage thermocouples may be configured to measure a temperature of the cooling stage.

In some embodiments the controls of the processing apparatus 200 are set to deposit a TiN liner layer by ALD followed by deposition of a Co seed layer by ALD. Controls are set to cause the robot 250 to transport a wafer from the load lock chamber 210 to the WHC 220. The wafer may then optionally be moved via the robot 250 to an intermediate process module (not shown) for pre-deposition treatment.

Following pre-deposition treatment, the wafer is moved by the robot 250 to deposition process module 230. The controls are set to deposit a TiN liner layer on the wafer in module 230 by ALD. In some embodiments the controls are set to end the TiN deposition process by exposing the substrate to $TiCL_4$. Following deposition of TiN, the wafer is moved back to the WHC 220 by the robot 250. The wafer may then optionally be moved to the intermediate process module 240, which serves as a cooling module. Following cooling in the intermediate process module 240 the wafer is moved back to WHC 220 by the robot 250 and then back to the deposition process module 230 where a cobalt seed layer is deposited. Following deposition of the cobalt seed layer the wafer is moved back to the WHC 220 and optionally moved on to intermediate processing module 240 for further treatment, such as cooling. The wafer may then be moved to a different processing module for subsequent processing, or removed from the wafer processing apparatus 200 through the load lock chamber 210.

Figure 3:
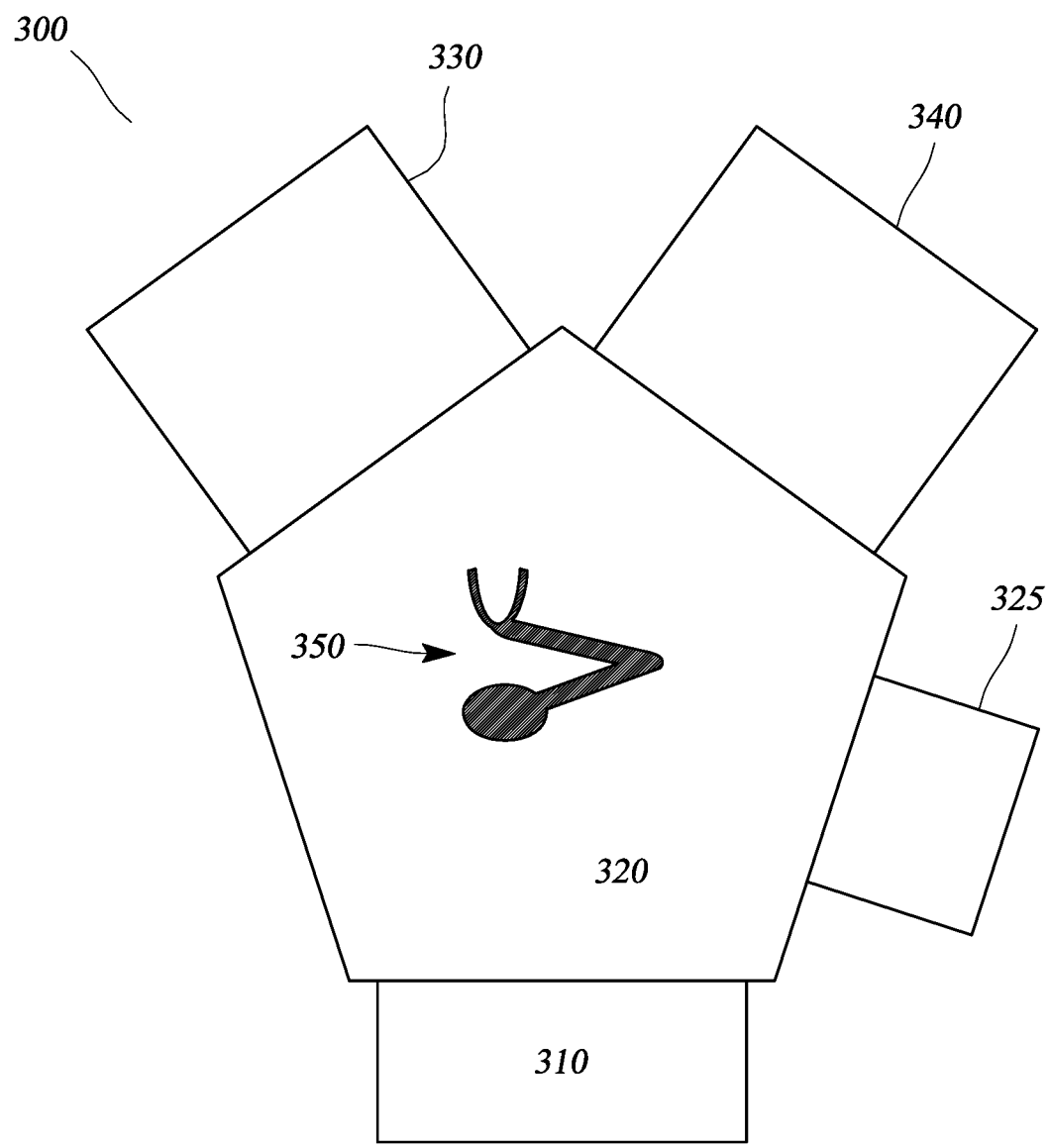
FIG. 3 is a top down schematic of a wafer processing apparatus according to some embodiments.

In some embodiments separate deposition process modules are used to deposit the TiN liner layer and the cobalt seed layer. Such a processing apparatus is illustrated in FIG. 3. In the processing apparatus 300, controls can be set to deposit a TiN liner layer in a first deposition process module 330, for example by ALD and to deposit a Co seed layer in a second process module 340, for example by ALD. In some embodiments controls are set to deposit the TiN liner layer by ALD (optionally with a final exposure to $TiCl_4$) followed by cooling and subsequent deposition of a Co seed layer by ALD, optionally followed by cooling. Controls are set transport a wafer from the load lock chamber 310 to the WHC 320. The wafer can then be transported to a TiN deposition module 330. Controls are set to deposit a TiN liner layer on the wafer in module 330 by ALD. Following deposition of TiN, the wafer is moved by the robot 350 back to the WHC 320, and then moved to cooling module 325. After sufficient time for the wafer to be cooled to a desired temperature, for example room temperature, the robot 350 moves the wafer from cooling module 325 back to the WHC 320 and then to deposition process module 340 where a cobalt seed layer is deposited. Following deposition of the cobalt seed layer the wafer is moved back to the WHC 320 by the robot 350. The wafer may then be optionally moved back to cooling module 325. After cooling to a desired temperature, the wafer may then be moved back to WHC 320. From there the wafer may be moved to a different processing module for subsequent processing, or removed from the wafer processing apparatus 300 through the load lock chamber 310.

In some embodiments deposition of the cobalt seed layer comprises deposition of both cobalt and TiN, as discussed above. Thus, in some embodiments the controls are set to move the wafer between process module 330 for TiN deposition and process module 340 for Co deposition as required to achieve the desired cobalt seed layer composition. In some embodiments deposition of both TiN and Co is carried out in the same process module and a cobalt seed layer comprising TiN is deposited in a single process module without the need to move the wafer.

In some embodiments an intermediate treatment before and/or after deposition of a TiN liner layer and Co seed layer can be conducted in the wafer handling chamber itself, rather than in a distinct, clustered processing module. For example, in some embodiments the wafer handling chamber may be provided with one or more cooling stages on which wafers may be placed to be cooled following treatment in one or more of the processing modules, such as after deposition of a TiN liner layer and/or a cobalt seed layer. In some embodiments the cooling apparatus in the wafer handling chamber may be exposed to the environment of the WHC and not located in a separate enclosure. In some embodiments the cooling apparatus may be located in a housing or other enclosure within the WHC. In some embodiments the cooling apparatus may be configured to cool two or more wafers.

In some embodiments the wafer handling robot itself may be configured to cool the wafer within the WHC. For example, when cooling is desired after a processing step the robot may remove the wafer from a deposition module and the wafer may remain on the end effector of the robot in the wafer handling chamber until a desired temperature is reached. In some embodiments the cooling on the end effector may be passive. In other embodiments active cooling of the wafer on the end effector may be carried out.

Figure 4:
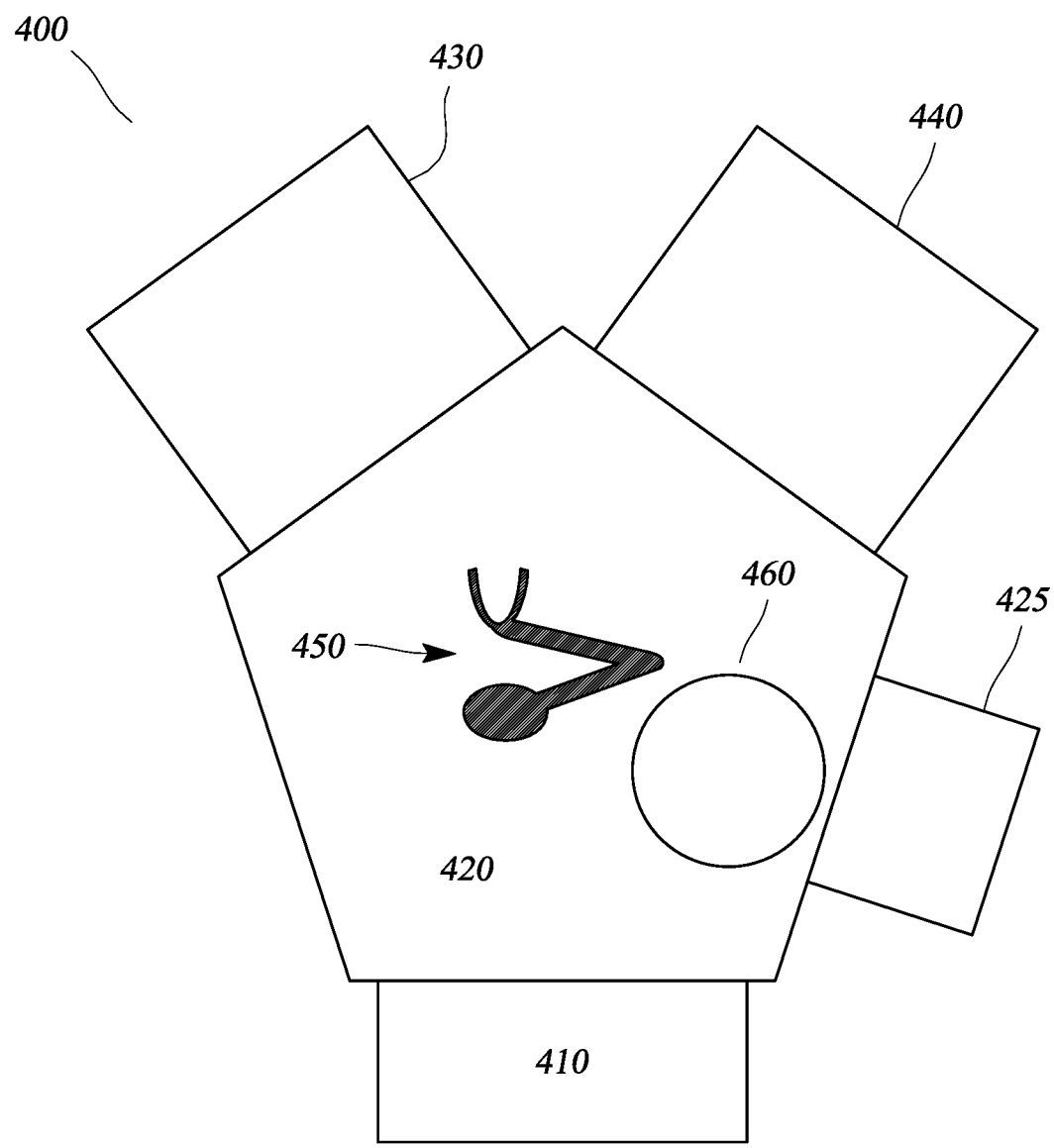
FIG. 4 is a top down schematic of a wafer processing apparatus according to some embodiments.

FIG. 4 illustrates a processing apparatus 400 comprising a wafer handling chamber 420 and a cooling stage 460 within the wafer handling chamber 420 itself. The processing apparatus 400 also includes two process modules 430, 440 and an intermediate process module 425, which may be, for example, a pre-clean module. The process modules 430, 440 may be used to deposit cobalt and TiN, respectively. For example, in some embodiments controls are set to deposit a TiN liner layer by ALD (optionally with subsequent treatment with titanium halide) in process module 430 followed by cooling in the WHC 420 and subsequent deposition of a Co seed layer by ALD in process module 440.

Controls are set transport a wafer from the load lock chamber 410 to the WHC 420. The wafer can then be transported by the robot 450 to the intermediate process module 425, for example for a pre-clean step. The wafer can then be transported via robot 450 to a TiN deposition module 430. A TiN liner layer is deposited in module 430, for example by ALD. Following deposition of TiN, the wafer is moved by the robot 450 back to the WHC 420 and placed on the cooling stage 460. After sufficient time for the wafer to be cooled to a desired temperature, for example room temperature, the robot 450 moves the wafer from cooling stage 460 to cobalt deposition module 440 where a cobalt seed layer is deposited.

Following deposition of the cobalt seed layer the wafer is moved back to the WHC 420. The wafer may then be optionally moved back to the cooling stage 460. After cooling to a desired temperature, the wafer may be moved to a different processing module for subsequent processing, or removed from the wafer processing apparatus 400 through the load lock chamber 410.

As mentioned above, in some embodiments a cobalt seed layer is formed by deposition of both TiN and Co. Thus, the wafer may be moved back and forth between TiN deposition module 430 and Co deposition module 440 to deposit a cobalt seed layer with a desired composition.

In some embodiments TiN and Co may be deposited in the same deposition module, such that movement between two modules is not required. Thus, in some embodiments a TiN liner layer is deposited on a wafer in a deposition module, the wafer is moved to the WHC or an intermediate process module for cooling, and the wafer is moved back to the same deposition module for deposition of a cobalt seed layer comprising both cobalt and TiN.

While not separately illustrated in the figures, it will be understood that each of the process steps disclosed herein can be programmed into a process tool controller that is electrically connected to control gas flow valves, mass flow controllers, gate valve actuators, substrate transfer robots, etc. The skilled artisan will readily appreciate that an apparatus can be provided with software programming or hard wiring to achieve the desired processing steps described herein.

What is claimed is:

1. A method of cobalt metallization comprising:
   depositing a TiN liner layer on a three-dimensional feature on a wafer by atomic layer deposition at a first deposition temperature in a first deposition process module;
   cooling the wafer to a temperature below the first deposition temperature;
   moving the wafer to a second deposition process module;
   depositing a cobalt seed layer directly over and contacting the TiN liner layer by atomic layer deposition at a second deposition temperature in the second deposition process module; and
   depositing cobalt over the cobalt seed layer by plating.

2. The method of claim 1, wherein cooling the wafer to a temperature below the first deposition temperature comprises moving the wafer to a cooling module.

3. The method of claim 1, wherein cooling the wafer to a temperature below the first deposition temperature comprises placing the wafer on a cooling stage.

4. The method of claim 1, additionally comprising cooling the wafer to a temperature below the second deposition temperature after depositing the cobalt seed layer and prior to depositing cobalt over the cobalt seed layer by plating.

5. The method of claim 4, wherein cooling the wafer to a temperature below the second deposition temperature comprises moving the wafer to a cooling module.

6. The method of claim 1, wherein the first deposition process module and the second deposition process module are the same.

7. The method of claim 1, wherein the cobalt seed layer comprises a mixture of cobalt and TiN.

8. The method of claim 7, wherein the cobalt seed layer additionally comprises a cobalt layer over the mixture of cobalt and TiN.

9. The method of claim 1, wherein the cobalt seed layer comprises a nanolaminate of TiN and cobalt layers.

10. The method of claim 9, wherein the cobalt seed layer additionally comprises a cobalt layer over the nanolaminate.

11. The method of claim 1, wherein the cobalt seed layer comprises a graded layer of TiN and cobalt.

12. The method of claim 11, wherein the graded layer comprises an increasing concentration of cobalt from an interface with the underlying TiN liner layer to the upper surface of the graded layer.

13. The method of claim 1, additionally comprising exposing the substrate to $TiCl_4$ after depositing the TiN liner layer and prior to depositing the cobalt seed layer.

* * * * *